United States Patent [19]
Hadderman et al.

[11] Patent Number: 6,094,397
[45] Date of Patent: Jul. 25, 2000

[54] METHOD AND APPARATUS FOR ADDRESSING MULTI-BANK MEMORY

[75] Inventors: Scott J. Hadderman, Pleasant Valley; Daniel J. Kolor, Wappingers Falls, both of N.Y.

[73] Assignee: International Business Machines Corporation, Armonk, N.Y.

[21] Appl. No.: 09/246,465

[22] Filed: Feb. 9, 1999

[51] Int. Cl.⁷ ...................................................... G11C 8/00
[52] U.S. Cl. ................................ 365/230.03; 365/230.06; 365/230.08
[58] Field of Search ......................... 365/230.03, 230.06, 365/230.08

[56] References Cited

U.S. PATENT DOCUMENTS

| | | | |
|---|---|---|---|
| 5,898,638 | 4/1999 | Keeth | 365/230.06 |
| 5,959,929 | 9/1999 | Cowles et al. | 365/230.03 |
| 5,963,497 | 10/1999 | Holland | 365/222 |

*Primary Examiner*—David Nelms
*Assistant Examiner*—Connie C. Yoha
*Attorney, Agent, or Firm*—Mark Ehrlich; Cantor Colburn LLP

[57] ABSTRACT

A method and apparatus for addressing multi-bank memory. The method includes generating a first bank select and generating a first row address. The first row address is stored and presented as a second bank select during an activate portion of the memory cycle. During an access portion of the memory cycle, a first bank select is generated and the saved second bank select is retrieved from storage. The first bank select and retrieved second bank select identify a bank of memory. The apparatus includes a storage device for saving the second bank select. The second bank select may be stored based on the value of the first bank select.

11 Claims, 9 Drawing Sheets

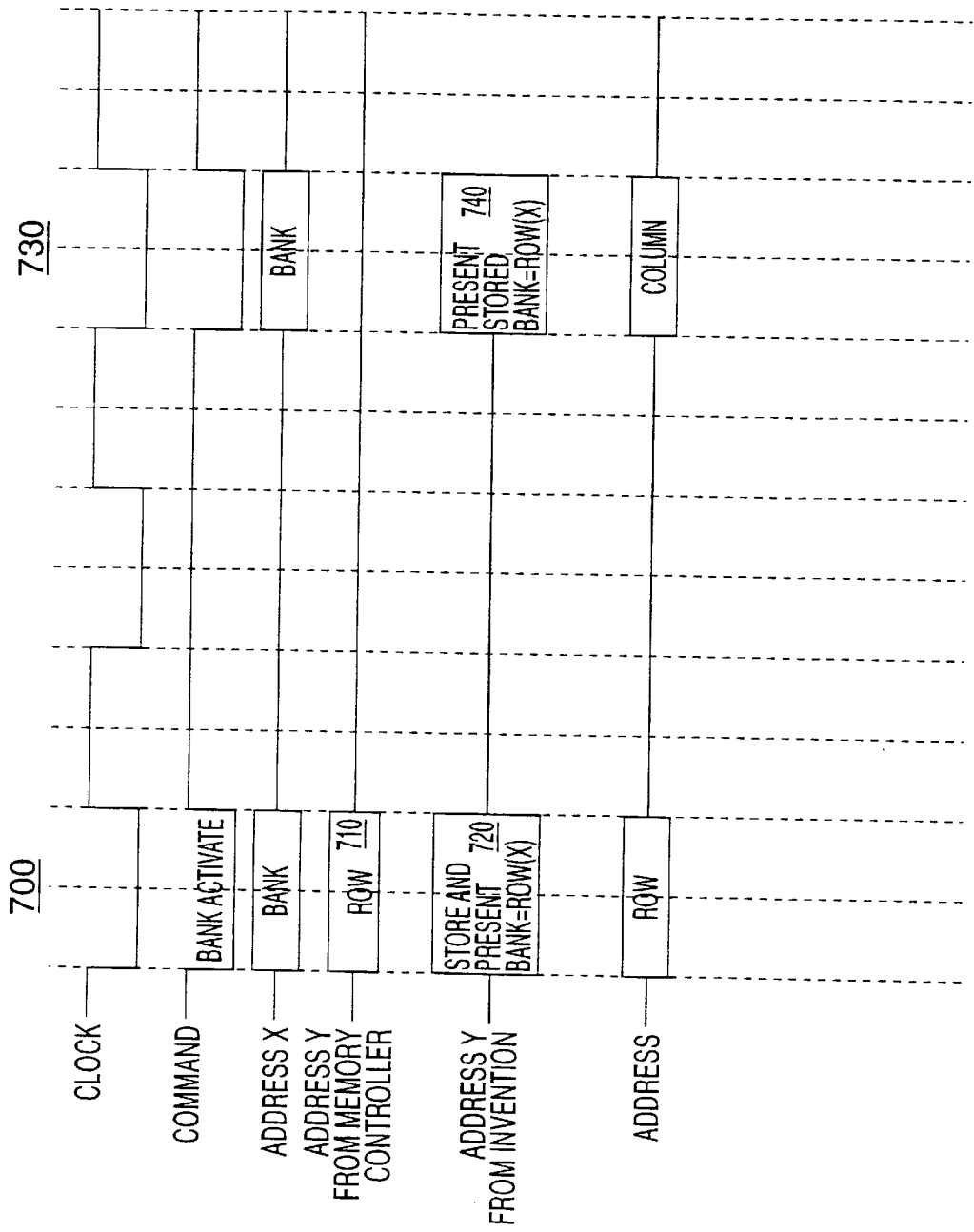

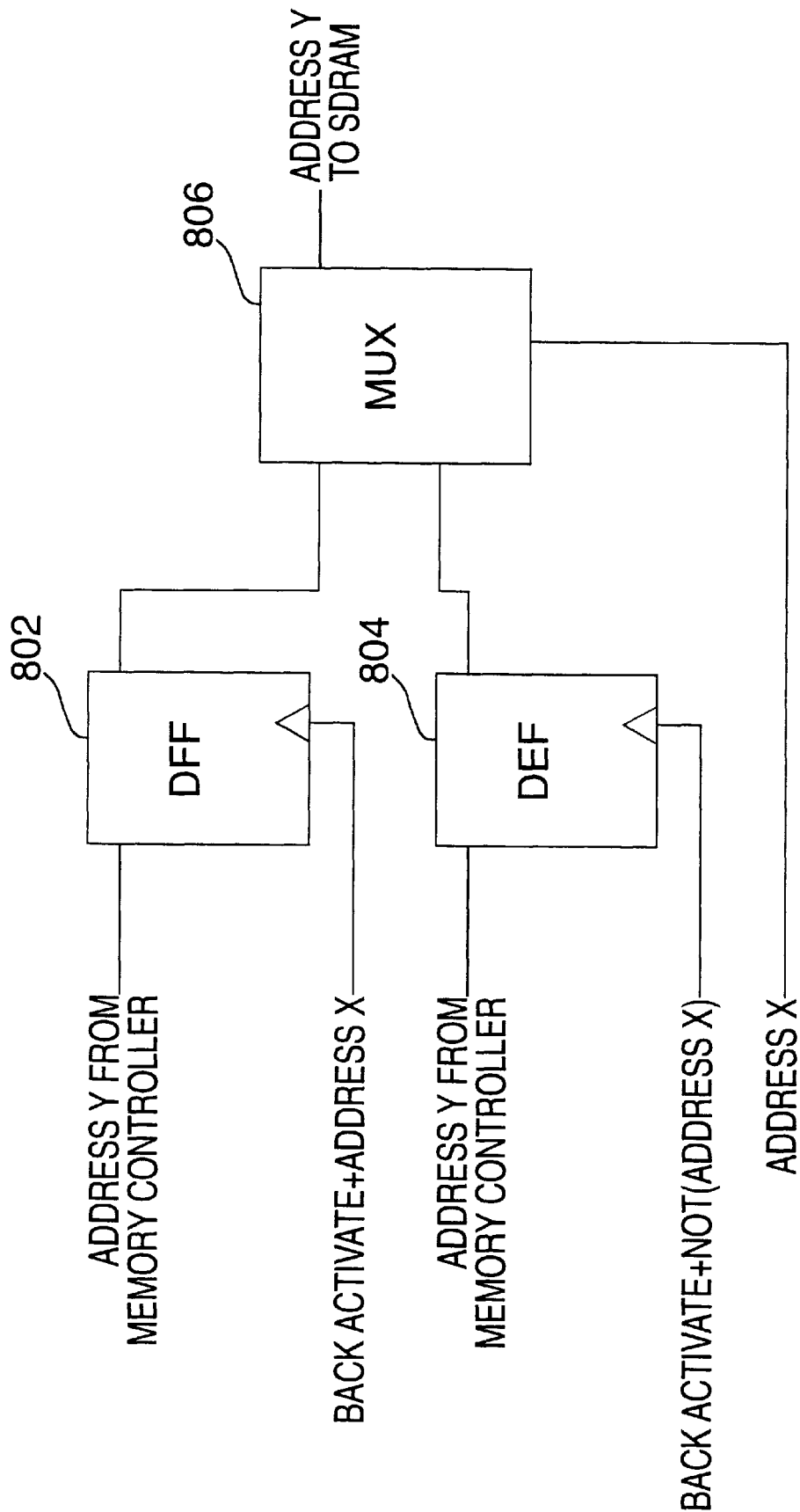

METHOD AND APPARATUS FOR ADDRESSING MULTI-BANK MEMORY

BACKGROUND OF THE INVENTION

The invention relates to a method and apparatus for addressing multi-bank memory and in particular relates to system for enabling a memory controller configured for use with N banks of memory to address M banks of memory. Dynamic Random Access Memory (DRAM) technology is continually evolving. Recently, DRAM evolved to a standard known as Synchronous DRAM (SDRAM). This version differs from previous DRAM technologies in that control and data signals are synchronized with a clock. Existing DRAMs, such as Fast Page Mode (FPM) and Extended Data Out (EDO), contain a single range of addresses, while SDRAM typically contain multiple ranges of addresses referred to as banks. These multiple ranges of address allow for more complex accesses to the DRAM. For example, address location 1 would only occur one time in a FPM/EDO DRAM while it would occur twice in a two bank DRAM (Bank A address location 1 and Bank B address location 1). As SDRAMs continued to evolve, they will increase in the number of banks. 16 Mb SDRAMs typically contain two banks. Newer 64 Mb SDRAMs typically contain four banks. Future SDRAMs will likely contain 8 or 16 banks.

The concept of banks can create a problem of compatibility between different versions and generations of SDRAM. Memory controllers designed to operate with a specific number of banks will not be able to operate with the increased number of banks associated with newer SDRAM generations. This may prohibit systems based on a particular memory controller to take advantage of densities and prices of newer SDRAM generations and may even limit the system's lifetime due to limited availability of older SDRAM generations.

BRIEF SUMMARY OF THE INVENTION

The above-discussed and other drawbacks and deficiencies of the prior art are overcome or alleviated by the method and apparatus for addressing multi-bank memory of the present invention. The method includes generating a first bank select and generating a first row address. The first row address is stored and presented as a second bank select during an activate portion of the memory cycle. During an access portion of the memory cycle, a first bank select is generated and the saved second bank select is retrieved from storage. The first bank select and retrieved second bank select identify a bank of memory. The apparatus includes a storage device for saving the second bank select. The second bank select may be stored based on the value of the first bank select.

BRIEF DESCRIPTION OF THE DRAWINGS

Referring now to the drawings wherein like elements are numbered alike in the several FIGURES:

FIG. 8 is a timing diagram of activate and access operations performed in accordance with a second embodiment of the invention; and FIG. 9 is a block diagram of circuitry for implementing the second embodiment of the invention.

DETAILED DESCRIPTION OF THE PREFERRED EMBODIMENTS

Figure 1:
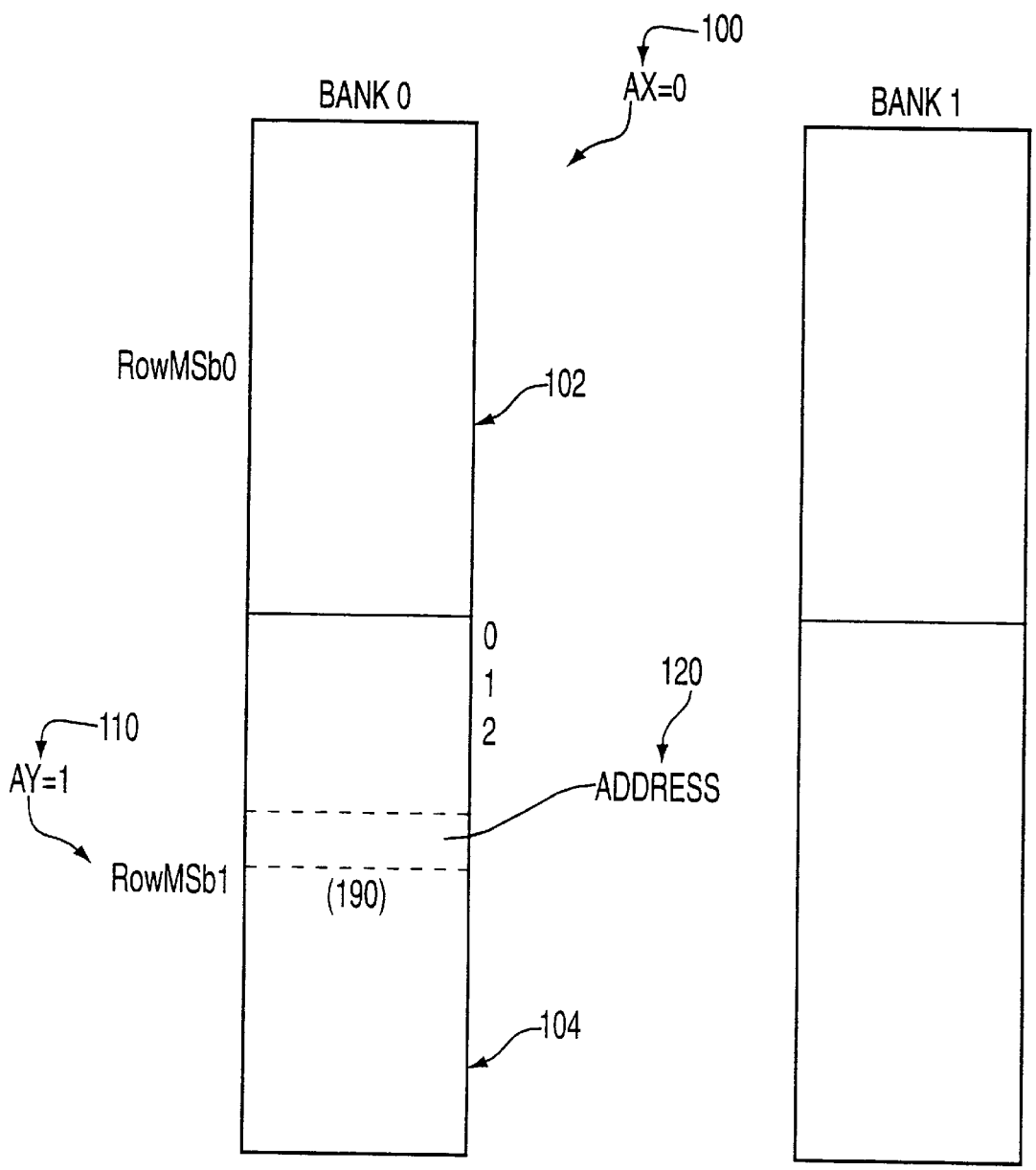
FIG. 1 illustrates the process of activating a memory location in a two bank memory.

Addressing a location in a memory having multiple banks is a two step process involving first activating a bank and then accessing the bank. FIG. 1 depicts the activation of a bank in a two bank memory. In a two bank memory, a single address bit is used as a bank select. As shown in FIG. 1, address bit AX shown at 100 is used to select either Bank 0 or Bank 1. When the memory controller activates a bank from a two bank memory, the controller will choose either Bank 0 by presenting AX as low or Bank 1 by presenting AX as high. At the same time, the controller must select a row. Due to the organization of a two bank memory, the row address can be separated into a most significant address bit AY shown at 110 and remaining address bits Address shown at 120. As shown in FIG. 1, Bank 0 is divided in half with a first set of rows 102 being designated by AY=0 and a second set of rows 104 being designated by AY=1. A row address 190 is specified through the remaining address bits Address 120. Thus, the controller activates a row by presenting AY 110 and Address 120.

Figure 2:
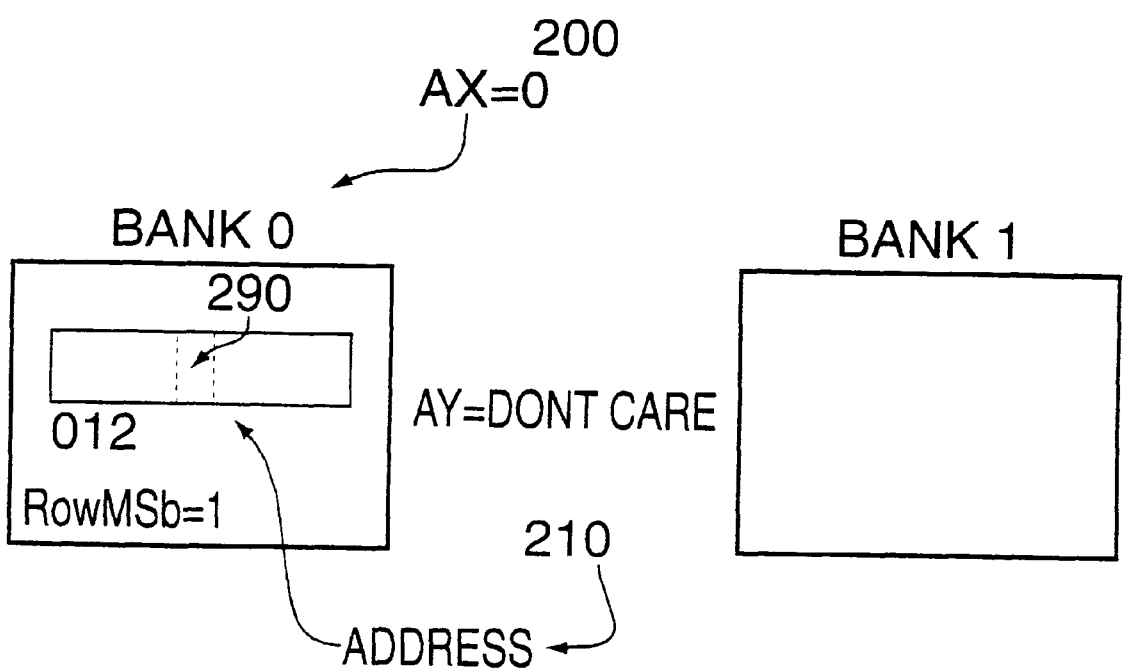
FIG. 2 illustrates the process of accessing a memory location in a two bank memory.

Once the bank has been activated, the memory controller can make an access to that bank. The access operation for a two bank memory is depicted in FIG. 2. To perform the access, the controller will select the bank by presenting bank select AX shown at 200 and will also present a column address 290 designating a location within the activated row using Address 210 to select a memory location 290 within Bank 0. Bank select AY is not needed for this portion of the bank access because the active row is associated with the active bank and no other rows are accessible in that activated bank. Thus, the column Address 210 can only be applied to one row in Bank 0 and bank select AY is unnecessary.

Figure 3:
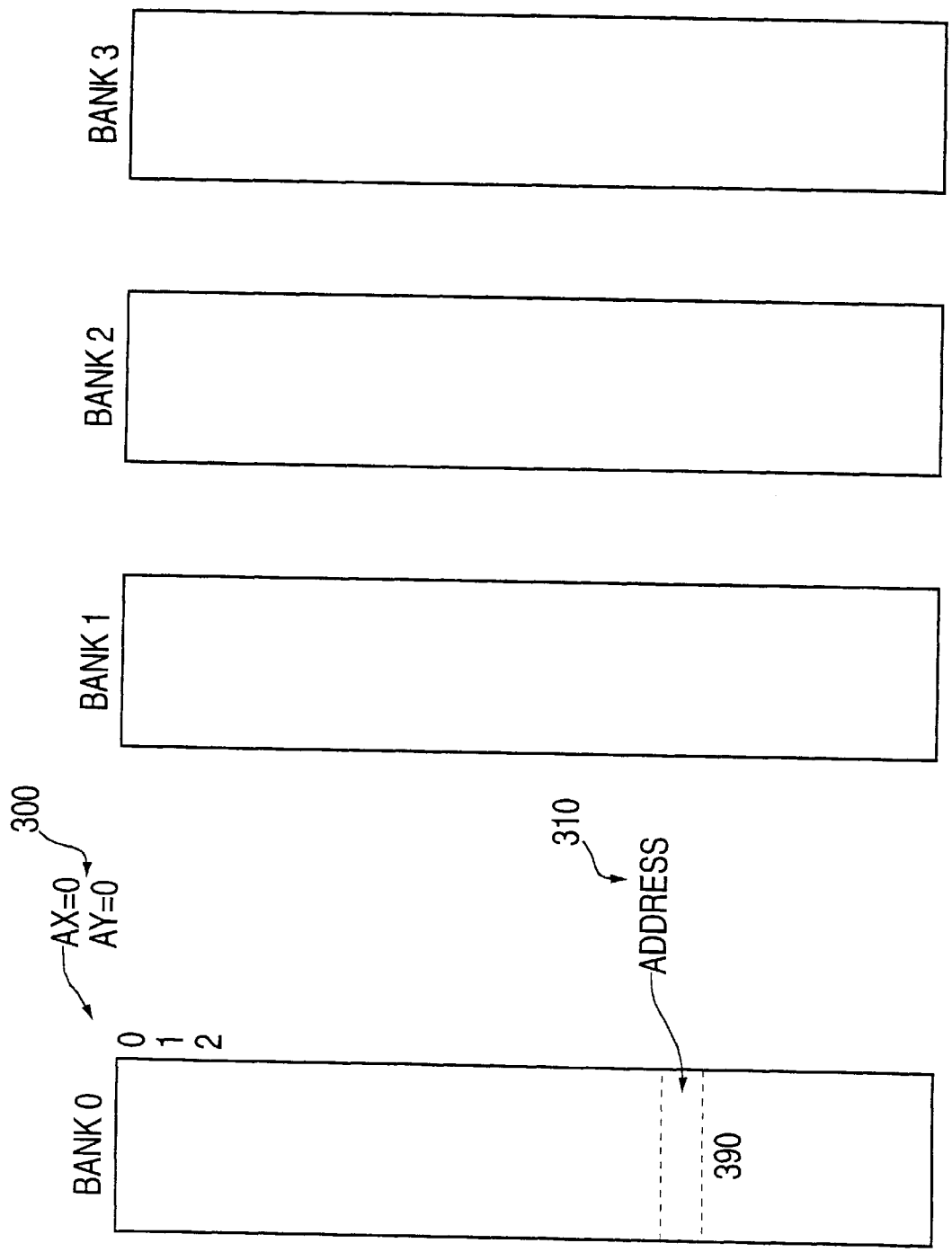
FIG. 3 illustrates the process of activating a memory location in a four bank memory.
Figure 4:
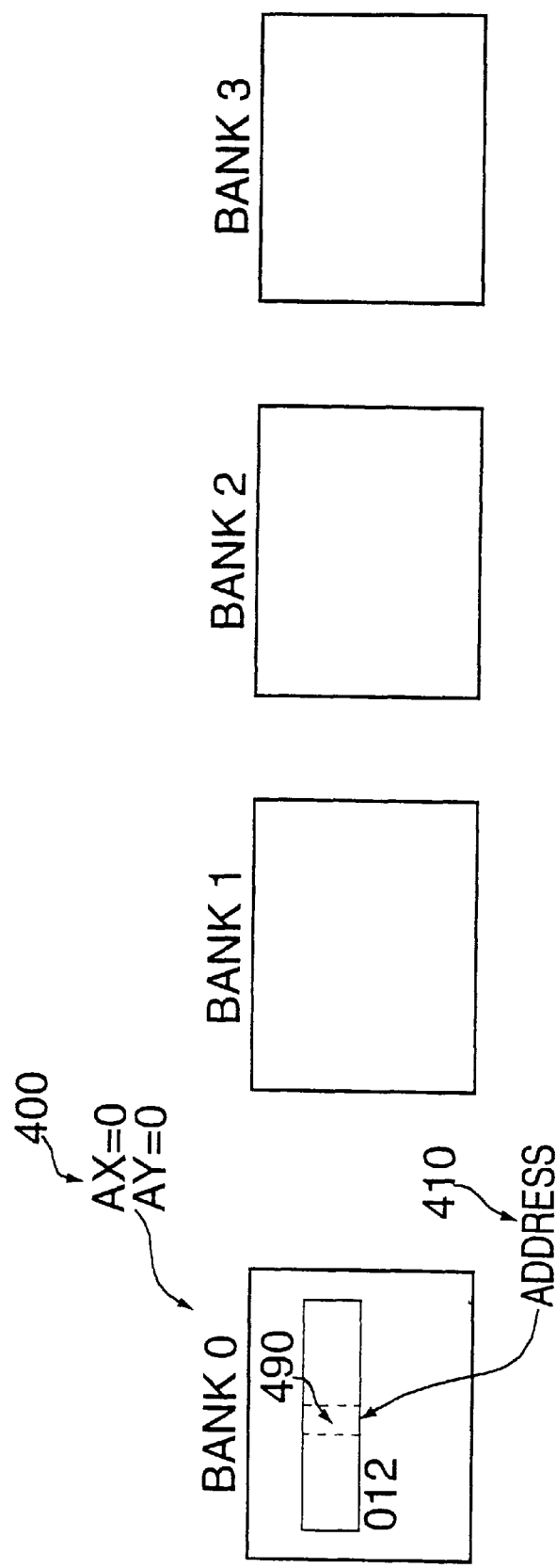
FIG. 4 illustrates the process of accessing a memory location in a four bank memory.

FIGS. 3 and 4 depict the activate and access operations in a four bank memory. In a four bank memory, two bits 300, typically AX and AY, are used as bank selects. Referring to FIG. 3, when the memory controller activates a bank from a four bank memory, the controller will present bank selects AX and AY to choose the appropriate bank. At the same time, the controller will select a row address by presenting Address 310. Now that the bank has been activated, the memory controller can make an access to that bank. Referring to FIG. 4, the controller selects the previously activated bank by presenting bank selects AX and AY as shown at 400. This designates the appropriate bank. The controller also identifies a column address 490 within that bank using Address 410. Bank select AY is needed for this portion of the bank access as it determines which bank is to be accessed.

Figure 5:
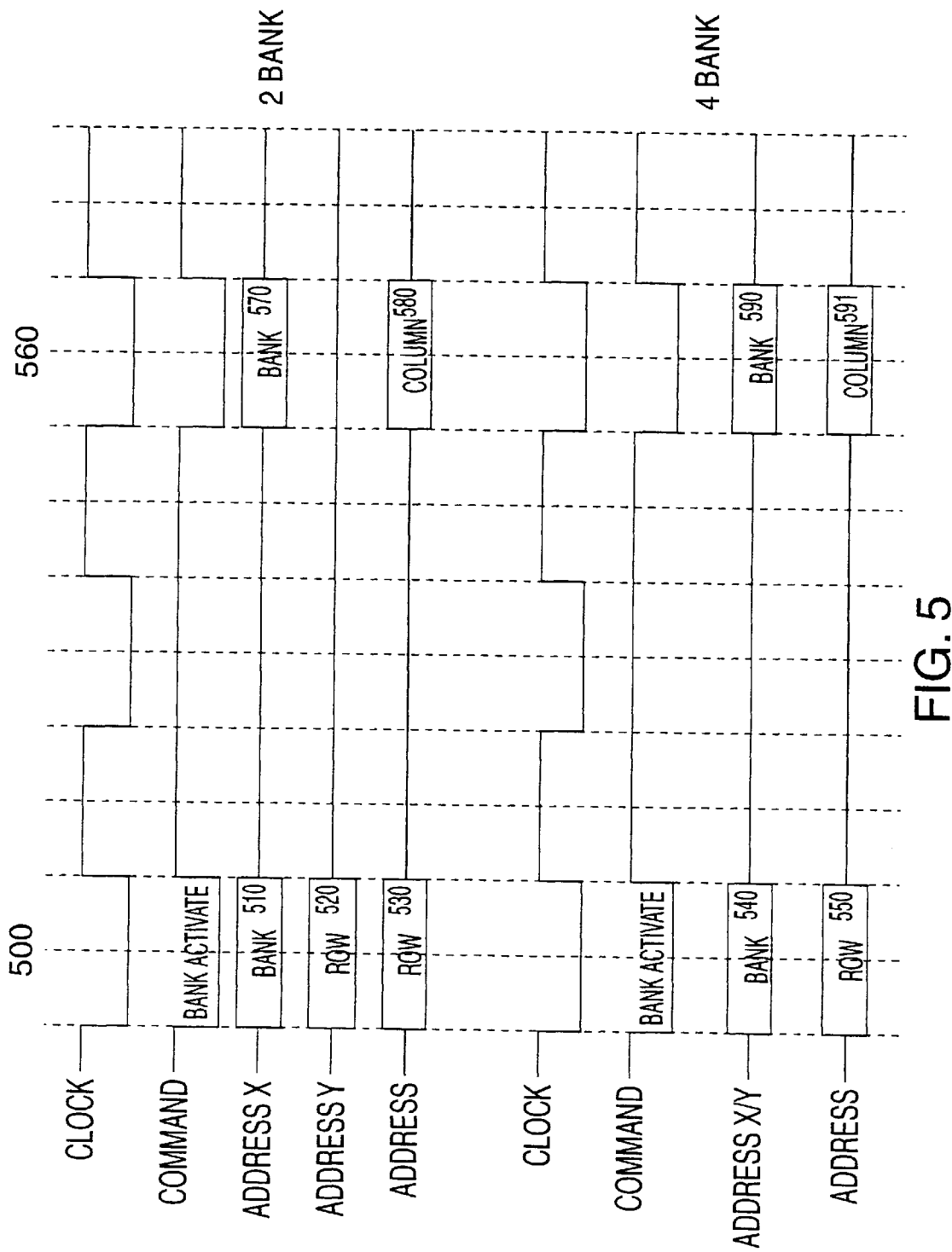
FIG. 5 is a timing diagram of the activate and access operations in both two bank and four bank memory.

FIG. 5 is a timing diagram depicting both the activate and access operations for two bank and four bank memory. The activate portion 500 of the cycle selects a bank and row address which will be activated and available for accessing. In the case of the two bank memory, at activation, AX is used as a bank select 510. Bit AY is used as a row select 520 and the remaining address bits Address are used as row select 530 as described above with reference to FIG. 1. In the case of the four bank memory, at activation, bank selects AX and AY are both used as a bank select 540. The remaining address bits Address are used to identify a row at 550.

The next stage of the sequence is to access the bank as shown at 560. In the case of the two bank memory, AX is used as a bank select 570. As described above, the row address associated with the bank during the activation portion 500 of the sequence is not needed for the access portion of the sequence 560. Therefore, AY is not used and address bits Address select a column 580 within the bank/row. In the case of the four bank memory, AX and AY are both required as bank selects 590 which identify one of the four banks to be accessed. The address bits Address are used during the access portion 560 of the sequence to select a column 591 within the bank/row.

If a system is configured for a two bank memory, the memory controller is not designed to present AY during the access portion of the sequence as AY is redundant. As described above, AY is used to select a row during bank activation and this row is the only row accessible during the access to that bank. Since only one row can be accessed given a particular bank, AY becomes redundant during access of a two bank memory. AY, however, is needed when accessing a four bank memory because it determines which of the four banks is to be accessed. The invention stores the value of AY during the activate portion of the sequence and presents AY during both the activates and access portions of the memory cycle to enable a two bank memory controller to access a four bank memory.

Figure 6:
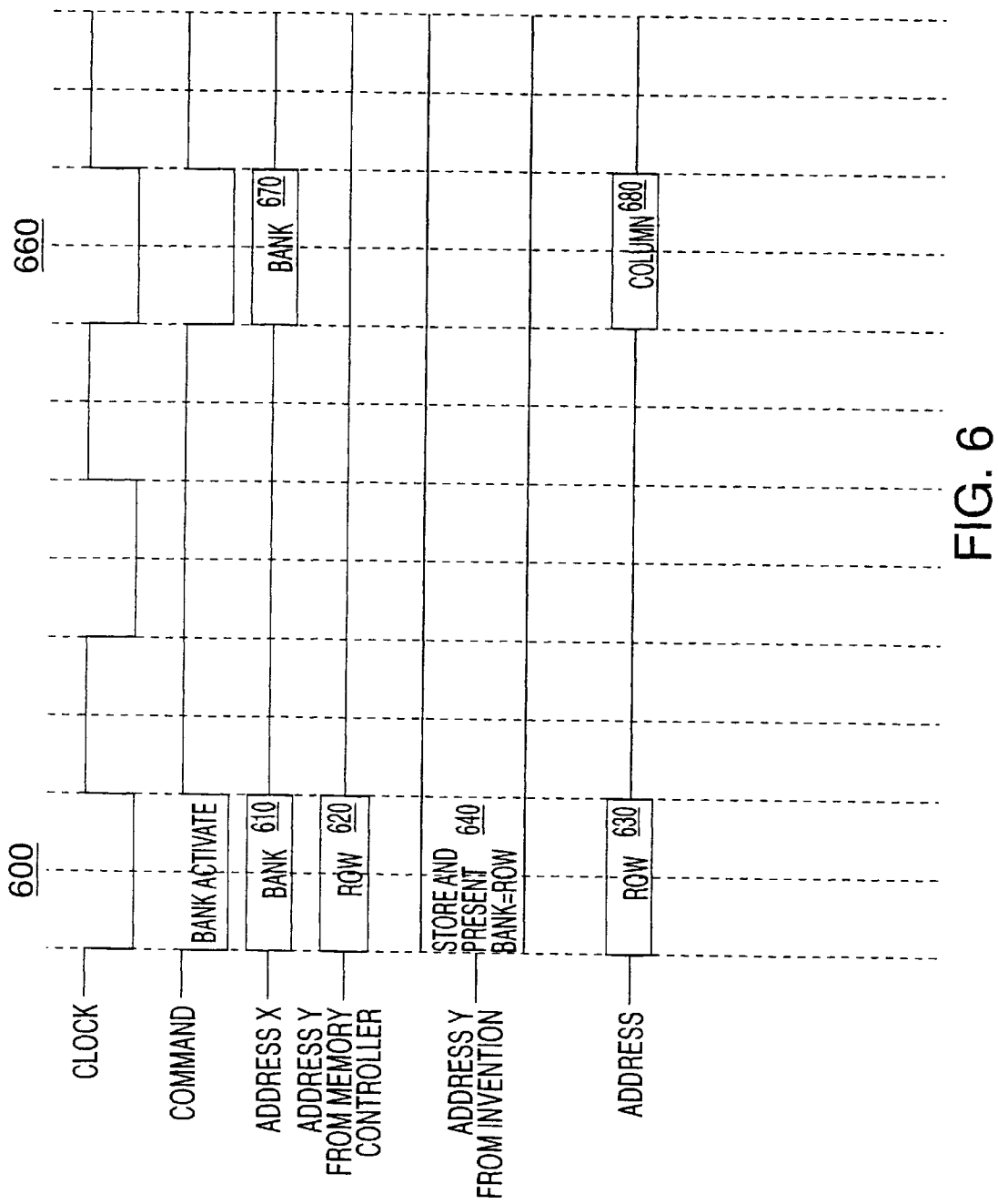
FIG. 6 is a timing diagram of activate and access operations performed in accordance with a first embodiment of the invention.

A first embodiment of the invention stores the value of AY during the activate portion of the sequence. FIG. 6 depicts an activate and access sequence in accordance with a first embodiment of the invention for enabling a two bank controller to address a four bank memory. As shown in FIG. 6, during the bank activate portion 600 of the sequence, AX is used as a first bank select 610. Address AY is generated by the memory controller at 620. When accessing a two bank memory, address AY is used to identify a row in a bank identified by AX. In the embodiment shown in FIG. 6, address AY is stored and presented as a second bank select at 640. The first bank select AX and the second bank select AY designate one of four banks. The remaining bits Address are used to designate a row in the designated bank at 630.

The access portion 660 of the sequence presents first bank select AX as shown at 670. The second bank select AY remains fixed from the activate portion 600 to the access portion 660 which is illustrated in FIG. 6 as box 640 continuing from the activate portion 600 to the access portion 660. Address bits Address are used to identify a column at 680 in the activated row in the designated bank.

The invention provides the first and second bank select AX and AY, the row address and the column address needed to address a four bank memory. The second bank select AY is fixed for the entire address cycle. The advantage of this embodiment is that implementation logic (described below with reference to FIG. 7) is minimized and implementation speed will be maximized. A limitation of this embodiment is that the memory controller is limited in which bank/address combinations that can be accessed. Once the value of second bank select AY is stored, it cannot be changed until the activated bank is precharged. Thus, the memory controller is limited to the same second bank select AY regardless of the value of the first bank select AX.

Figure 7:
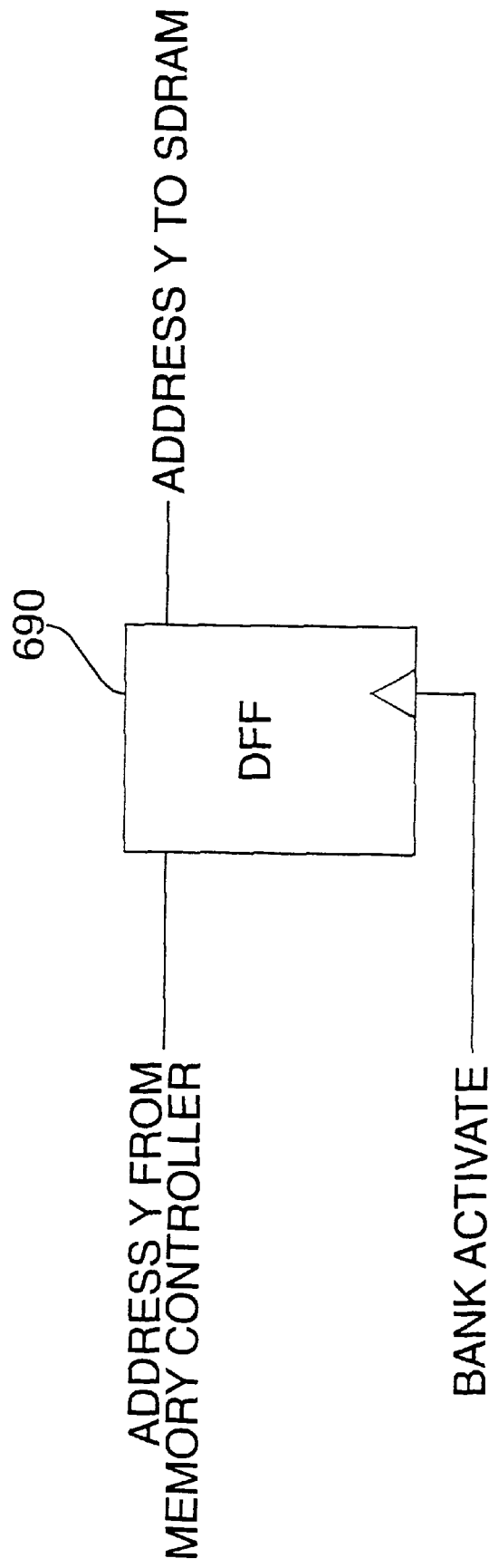
FIG. 7 is a block diagram of circuitry for implementing the first embodiment of the invention.

Exemplary circuitry for implementing the first embodiment is shown in FIG. 7. A latch 690 stores the value of the second bank select AY during the activate portion 600 of the memory cycle. The Bank Activate signal acts as a strobe to the latch 690 and allows the value of AY to be used as the second bank select in the activate portion 600. When Bank Activate becomes inactive, the latch holds the value of AY for use as a second bank select signal during the later, access portion 660 of the memory cycle. It is understood that any type of storage device may be used to store the second bank select AY and a latch is exemplary.

A second embodiment of the invention is described with reference to FIGS. 8 and 9. In the second embodiment, the stored second bank select AY is a function of the bank select AX. When the row address AY shown at 710 is presented from the memory controller during the activate phase 700, its value is stored and presented as a second bank select as depicted at 720. The second bank select AY is stored as a function of the first bank select AX. As described below with reference to FIG. 9, a different bank select AY can be stored for each value of bank select AX. The stored bank select AY is used in the access portion 730 of the sequence as the second bank select to access a four bank memory. When the memory controller makes an access, the bank select AY associated with the particular bank select AX is presented as the second bank select as depicted at 740. In this way, each of the bank AX selects (e.g. 0 or 1) can have a unique second bank select AY allowing the memory controller address flexibility.

Exemplary circuitry for implementing the second embodiment is shown in FIG. 9. The circuitry includes a first latch 802 and a second latch 804. The strobe signals to latches 802 and 804 are dependent on AX and NOT (AX), respectively. Depending on the state of AX (e.g. 0 or 1), one of the two latches 802 and 804 will store a second bank select AY. The additional latch allows for a second bank select to be stored for both values of the bank select AX. For example, AX=0 may be associated with the bank select AY stored in latch 802 and AX=1 may be associated with the bank select AY stored in latch 804. The multiplexer 806 is used to determine which latch data will be presented to the memory as a second bank select AY and is controlled by AX. It is understood that any type of storage device may be used to store the second bank select AY and latches are exemplary. In addition, different switching devices may be used instead of multiplexer 806. This embodiment allows for two bank activation but the addition of the multiplexer 806 results in additional delay in accessing the memory.

The invention has been described in the context of creating compatibility between a two bank memory controller and a four bank memory (e.g. SDRAM). It is understood that the invention is applicable to any number of controller/memory combinations.

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A method of addressing a memory having M banks using a memory controller configured to address N banks, M being larger than N, the method comprising:

in an activate portion of a memory address sequence in a memory controller configured for N banks;

generating a N bank memory first bank select;

generating a N bank memory first row address;

saving said N bank memory first row address as a M bank memory second bank select; and identifying a bank of the M bank memory in response to
said N bank memory first bank select and said M bank memory second bank select.

2. The method of claim 1 further comprising:

in an access portion of the memory address sequence in said memory controller configured to address N banks;

generating a N bank memory first bank select;

retrieving said saved M bank memory second bank select; and identifying a bank of the said M bank memory in response to said N bank memory first bank select and said M bank memory second bank select.

3. The method of claim 1 wherein said saving of said N bank memory first row address as a M bank memory second bank select comprises saving said M bank memory second bank select as a function of said N bank memory first bank select.

4. The method of claim 2 wherein said retrieving of said saved M bank memory second bank select comprises retrieving said M bank memory second bank select based on a value of said N bank memory first bank select.

5. A system including:

a memory controller configured to address N banks and a memory having M banks, M being larger than N, the memory controller generating a N bank memory first bank select and a N bank memory row address identifying one or more rows in a selected bank; and, a storage device for storing said N bank memory row address and presenting said N bank memory row address as a M bank memory second bank select to identify a bank of the said M bank memory.

6. The system of claim 5 wherein said storage device presents said M bank memory second bank select during an activation portion of a memory access sequence.

7. The system of claim 5 wherein said storage device presents said M bank memory second bank select during an access portion of a memory access sequence.

8. The system of claim 5 wherein said storage device stores two M bank memory second bank selects; said M bank memory second bank select and an additional M bank memory second bank select, said improvement further comprising:

a switching device for selecting between the two said M bank memory second bank selects to identify a bank of the M bank memory.

9. The system of claim 8 wherein said switching device is responsive to said N bank memory first bank select.

10. The method of claim 1 wherein N is equal to two and M is equal to four.

11. The system of claim 5 wherein N is equal to two and M is equal to four.

* * * * *